US008335967B2

(12) United States Patent
Takashima

(10) Patent No.: US 8,335,967 B2
(45) Date of Patent: Dec. 18, 2012

(54) MEMORY SYSTEM

(75) Inventor: Daisaburo Takashima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 402 days.

(21) Appl. No.: 12/673,904

(22) PCT Filed: Aug. 7, 2008

(86) PCT No.: PCT/JP2008/064570
§ 371 (c)(1),
(2), (4) Date: Feb. 17, 2010

(87) PCT Pub. No.: WO2009/025229
PCT Pub. Date: Feb. 26, 2009

(65) Prior Publication Data
US 2011/0010606 A1    Jan. 13, 2011

(30) Foreign Application Priority Data
Aug. 17, 2007    (JP) .................................. 2007-213153

(51) Int. Cl.
G11C 29/00    (2006.01)
(52) U.S. Cl. ........................................ 714/773; 714/752
(58) Field of Classification Search .................. 714/752, 714/773
See application file for complete search history.

(56) References Cited

U.S. PATENT DOCUMENTS

| | | | |
|---|---|---|---|
| 5,267,204 A | 11/1993 | Ashmore, Jr. | |
| 5,936,885 A | 8/1999 | Morita et al. | |
| 2004/0143699 A1 | 7/2004 | Norman | |
| 2006/0259716 A1* | 11/2006 | Moschopoulos | 711/156 |
| 2006/0294447 A1* | 12/2006 | Mackey | 714/752 |
| 2007/0028035 A1 | 2/2007 | Nishihara | |

FOREIGN PATENT DOCUMENTS

| | | |
|---|---|---|
| DE | 196 10 838 A1 | 2/1997 |
| JP | 6 214891 | 8/1994 |
| JP | 10 255483 | 9/1998 |
| JP | 11 25002 | 1/1999 |
| JP | 11 177036 | 7/1999 |
| JP | 2000 22010 | 1/2000 |
| JP | 2005-100527 | 4/2005 |
| JP | 2005 209324 | 8/2005 |
| JP | 2006 92744 | 4/2006 |
| JP | 2007 58840 | 3/2007 |
| WO | WO 89/03557 | 4/1989 |

* cited by examiner

Primary Examiner — Sam Rizk
(74) Attorney, Agent, or Firm — Oblon, Spivak, McClelland, Maier & Neustadt, L.L.P.

(57) ABSTRACT

A memory system that can efficiently relieve a large number of defective bits with a small number of redundant bits is provided in a Flash-EEPROM nonvolatile memory. A memory system according to an embodiment of the present invention comprises a Flash-EEPROM memory in which a plurality of memory cells having a floating gate or a charge trapping layer and capable of electrically erasing and writing data are arranged; a control circuit that controls a cache memory and the Flash-EEPROM memory; and an interface circuit that communicates with outside, wherein a plurality of group data and a plurality of flag data for storing presence of inversion of all bits of respective group data are stored in a memory area of the Flash-EEPROM memory.

19 Claims, 26 Drawing Sheets

| 64Cell(R0) | | | 64Cell(R1) | | | ... | 64Cell(R511) | | | ECC 64Cell(RE0) | | | ... | ECC 64Cell(RE19) | |
|---|---|---|---|---|---|---|---|---|---|---|---|---|---|---|---|
| N0 | N1 | ...N63 | N64 | N65 | ...N127 | ... | 4KB-64 | 4KB-63 | ...4KB-1 | E0 | E1 | ...E63 | ... | E160B-64 | ...E160B-1 |
| (1) | 0 | ...0 | 1 | 0 | ...0 | ... | 1 | 0 | ...0 | 1 | 0 | ...0 | ... | 0 | ...1 |
| 1 | 1 | ...1 | 1 | 0 | ...1 | ... | 0 | (1) | ...1 | 0 | (0) | ...1 | ... | 1 | ...0 |
| 0 | 0 | ...1 | (1) | 0 | ...1 | ... | 0 | 1 | ...0 | 1 | 1 | ...0 | ... | 1 | ...1 |
| 0 | 1 | ...0 | 1 | 1 | | ... | 1 | 0 | ...1 | 0 | 1 | ...0 | ... | 0 | ...0 |
| | ... | | | ... | | ... | | ... | | | ... | | ... | | ... |
| 1 | (1) | ...1 | 0 | 0 | ...1 | ... | 1 | 0 | ...1 | 0 | 1 | ...0 | ... | 1 | ...0 |
| 0 | 0 | ...1 | 0 | 1 | ...0 | ... | 0 | 1 | ...0 | 1 | 1 | ...1 | ... | 1 | ...1 |
| 1 | 0 | ...0 | 1 | 1 | ...1 | ... | 0 | 0 | ...(0) | 1 | 0 | ...1 | ... | (0) | ...0 |
| 0 | 0 | ...0 | 1 | (1) | ...0 | ... | 1 | 1 | ...0 | 1 | 1 | ...1 | ... | 0 | ...1 |

FIG.1E

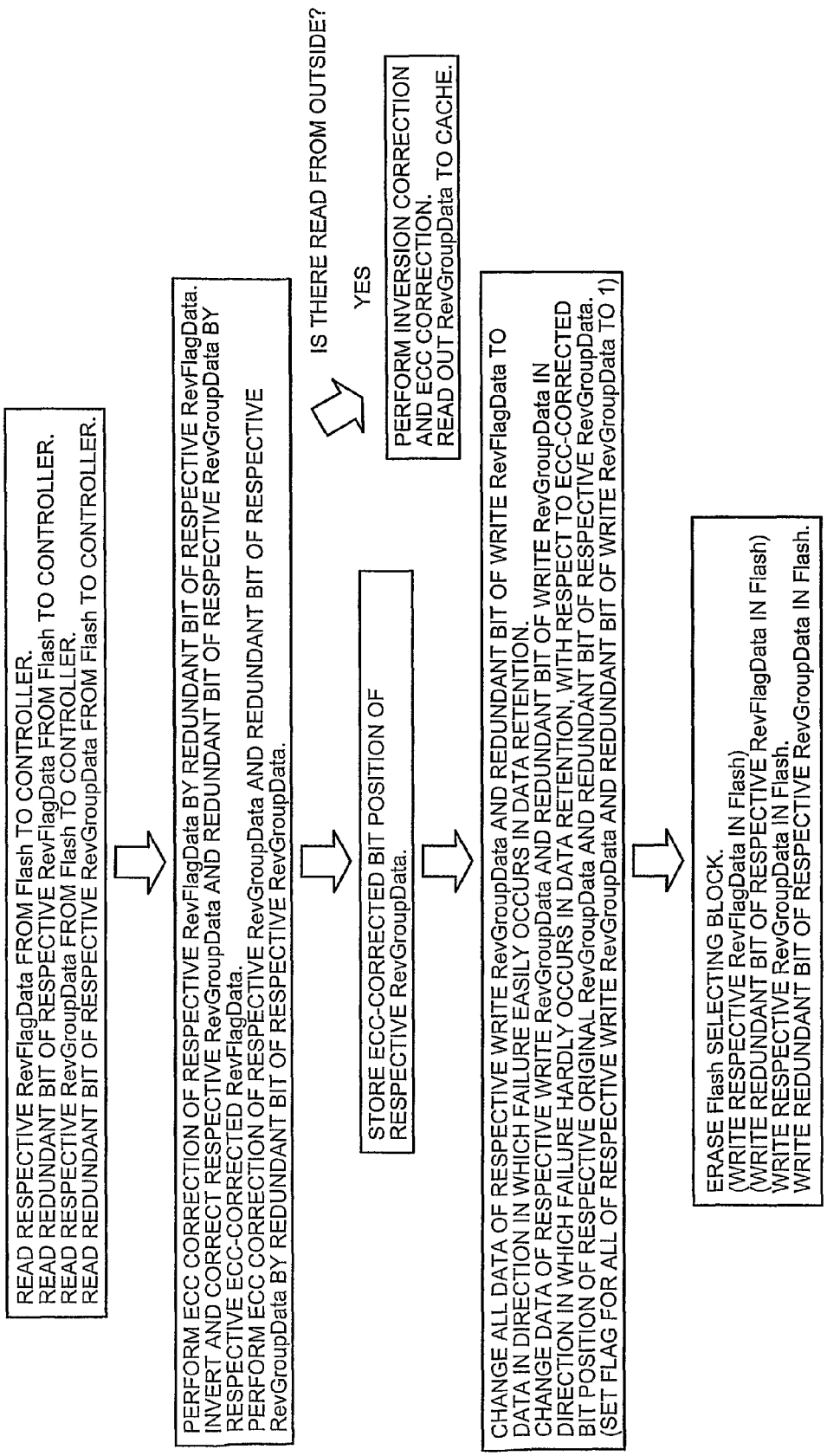

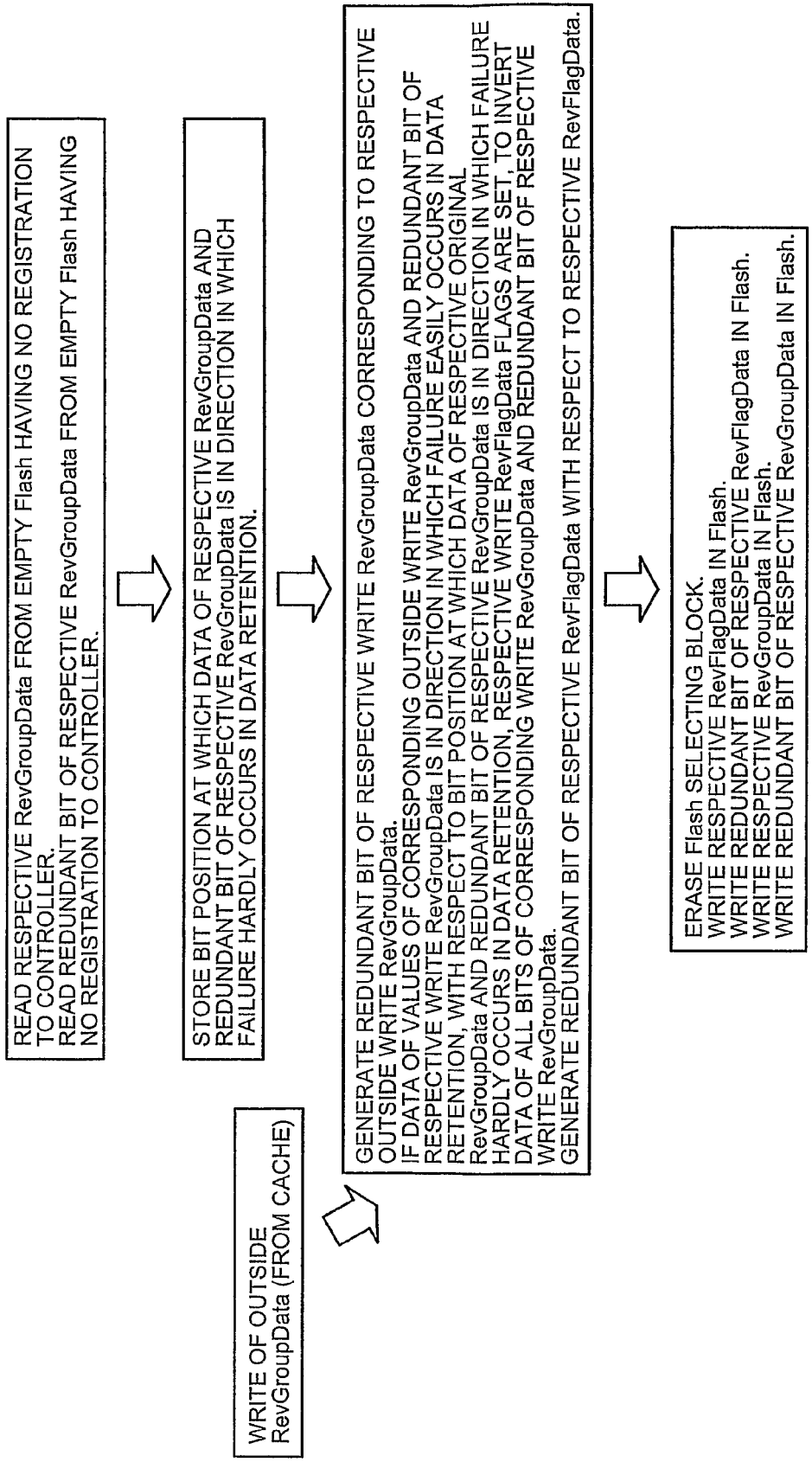

FIG.4

|  | UNIT CAPACITY | CORRECTION BIT | REQUIRED REDUNDANT BIT |
|---|---|---|---|
| ECC | 512B | 8bit | 20B |
|  | (4KB) | (64bit) | (160B) |
|  |  |  |  |
| Redundancy | 1GB | 4Kbit | 16MB+8KB fuse |
|  | (4KB) | (0.016bit) | (64B+0.03B Fuse) |
|  |  |  |  |
| EMBODIMENT | 128bit | 1bit | 1bit |
|  | (4KB) | (256bit) | (32B+1.25B) |
|  | 64bit | 1bit | 1bit |
|  | (4KB) | (512bit) | (64B+2.5B) |
|  | 32bit | 1bit | 1bit |
|  | (4KB) | (1024bit) | (128B+5B) |

| 64Cell(R0) | | | 64Cell(R1) | | | ... | 64Cell(R511) | | | ECC 64Cell(RE0) | | | ... | ECC 64Cell(RE19) | | |
|---|---|---|---|---|---|---|---|---|---|---|---|---|---|---|---|---|
| N0 | N1 | ...N63 | N64 | N65 | ...N127 | ... | 4KB-64 | 4KB-63 | ...4KB-1 | E0 | E1 | ...E63 | ... | E160B-64 | ... | E160B-1 |
| ①  | 0 | ...0 | 1 | 0 | ...0 | ... | 1 | 0 | ...0 | 1 | 0 | ...0 | ... | 0 | ... | 1 |
| 1 | 1 | ...1 | 1 | 0 | ...1 | ... | 0 | 1 | ...1 | 0 | ⓪ | ...1 | ... | 1 | ... | 0 |
| 0 | 0 | ...1 | ①  | 0 | ...1 | ... | 0 | 1 | ...0 | 1 | 1 | ...0 | ... | 1 | ... | 1 |
| 0 | 1 | ...0 | 1 | 1 | ... | ... | 1 | 0 | ...1 | 0 | 1 | ...0 | ... | 0 | ... | 0 |
| | | ... | | | ... | ... | | | ... | | | ... | ... | | ... | |
| 1 | 1 | ...1 | 0 | 0 | ...1 | ... | 1 | 0 | ...1 | 0 | 1 | ...0 | ... | 1 | ... | 0 |
| 0 | 0 | ...1 | 0 | 1 | ...0 | ... | 0 | 1 | ...0 | 1 | 1 | ...1 | ... | 1 | ... | 1 |
| 1 | 0 | ...0 | 1 | 1 | ...1 | ... | 0 | 0 | ...⓪ | 1 | 0 | ...1 | ... | 0 | ... | 0 |
| 0 | 0 | ...0 | 1 | 1 | ...0 | ... | 1 | 1 | ...0 | 1 | 1 | ...1 | ... | 0 | ... | 1 |

| Col+IO | Rev for Rcell | | R512Cell | | | R20Cell for ECC | | | 64Cell(R0) | | | 64Cell(R1) | | | ... | 64Cell(R511) | | | ECC 64Cell(RE0) | | | ECC 64Cell(RE19) | |
|---|---|---|---|---|---|---|---|---|---|---|---|---|---|---|---|---|---|---|---|---|---|---|---|
| | RR0 | ... | 8 | R0 | R1 | ... | R511 | RE0 | ... | RE19 | N0 | N1 | ... | N63 | N64 | N65 | ... | N127 | ... | 4KB-64 | 4KB-63 | ... | 4KB-1 | E0 | E1 | ... | E63 | ... | E160B-64 | ... | E160B-1 |
| Upper bit(Odd) | 1 | ... | 1 | 1 | 1 | ... | 1 | 1 | ... | 1 | ⓪ | 1 | ... | 1 | 1 | 1 | ... | 1 | ... | 1 | 1 | ... | 1 | 1 | 1 | ... | 1 | ... | 1 | ... | 1 |
| Upper bit(Even) | 1 | ... | 1 | 1 | 1 | ... | 1 | 1 | ... | 1 | 1 | 1 | ... | 0 | ① | 1 | ... | 1 | ... | 1 | 1 | ... | 1 | 1 | ⓪ | ... | 1 | ... | 1 | ... | 1 |
| Lower bit(Odd) | 0 | ... | 0 | 0 | 0 | ... | 0 | 0 | ... | 0 | 0 | 0 | ... | 0 | 0 | 0 | ... | 0 | ... | 0 | 0 | ... | 0 | 0 | 0 | ... | 0 | ... | 0 | ... | 0 |
| Lower bit(Even) | 0 | ... | 0 | 0 | 0 | ... | 0 | 0 | ... | 0 | 0 | 0 | ... | 0 | 0 | 0 | ... | 0 | ... | 0 | 0 | ... | 0 | 0 | 0 | ... | 0 | ... | 0 | ... | 0 |
| Upper bit(Odd) | 1 | ... | 1 | 1 | 1 | ... | 1 | 1 | ... | 1 | 1 | 1 | ... | 1 | 1 | 1 | ... | 1 | ... | 1 | 1 | ... | 1 | 1 | 1 | ... | 1 | ... | 1 | ... | 1 |
| Upper bit(Even) | 1 | ... | 1 | 1 | 1 | ... | 1 | 1 | ... | 1 | 1 | 1 | ... | 1 | 1 | 1 | ... | 1 | ... | 1 | 1 | ... | 1 | 1 | 1 | ... | 1 | ... | 1 | ... | 1 |
| Lower bit(Odd) | 0 | ... | 0 | 0 | 0 | ... | 0 | 0 | ... | 0 | 0 | 0 | ... | 0 | 0 | 0 | ... | 0 | ... | 0 | 0 | ... | 0 | 0 | 0 | ... | 0 | ... | 0 | ... | 0 |
| Lower bit(Even) | 0 | ... | 0 | 0 | 0 | ... | 0 | 0 | ... | 0 | 0 | 0 | ... | 0 | 0 | 0 | ... | 0 | ... | 0 | 0 | ... | ① | 0 | 0 | ... | 0 | ... | 0 | ... | 0 |

| 64Cell(R0) | | | 64Cell(R1) | | | ... | 64Cell(R511) | | | ECC 64Cell(RE0) | | | ... | ECC 64Cell(RE19) | | |
|---|---|---|---|---|---|---|---|---|---|---|---|---|---|---|---|---|
| N0 | N1 | ...N63 | N64 | N65 | ...N127 | ... | 4KB-64 | 4KB-63 | ...4KB-1 | E0 | E1 | ...E63 | ... | E160B-64 | ... | E160B-1 |
| 1 | 0 | ...0 | 1 | 0 | ...0 | ... | 1 | 0 | ...0 | 1 | 0 | ...0 | ... | 0 | ... | 1 |
| 1 | 1 | ...1 | 1 | 0 | ...1 | ... | 0 | 1 | ...1 | 0 | 0 | ...1 | ... | 1 | ... | 0 |
| 0 | 0 | ...1 | 1 | 0 | ...1 | ... | 0 | 1 | ...0 | 1 | 1 | ...0 | ... | 1 | ... | 1 |
| 0 | 1 | ...0 | 1 | 1 | | ... | 1 | 0 | ...1 | 0 | 1 | ...0 | ... | 0 | ... | 0 |
| | ... | | | ... | | | | ... | | | ... | | | | ... | |
| 1 | 1 | ...1 | 0 | 0 | ...1 | ... | 1 | 0 | ...1 | 0 | 1 | ...0 | ... | 1 | ... | 0 |
| 0 | 0 | ...1 | 0 | 1 | ...0 | ... | 0 | 1 | ...0 | 1 | 1 | ...1 | ... | 1 | ... | 1 |
| 1 | 0 | ...0 | 1 | 1 | ...1 | ... | 0 | 0 | ...0 | 1 | 0 | ...1 | ... | 0 | ... | 0 |
| 0 | 0 | ...0 | 1 | 1 | ...0 | ... | 1 | 1 | ...0 | 1 | 1 | ...1 | ... | 0 | ... | 1 |

FIG.8E

| Col+IO | Rev for Rcell | | R512Cell | | | R20Cell for ECC | | | 64Cell(R0) | | | 64Cell(R1) | | | 64Cell(R511) | | | ECC 64Cell(RE0) | | | ECC 64Cell(RE19) |
|---|---|---|---|---|---|---|---|---|---|---|---|---|---|---|---|---|---|---|---|---|---|
| | RR0 | ... 8 | R0 | R1 | ... R511 | RE0 | ... | RE19 | N0 | N1 | ... N63 | N64 | N65 | ... N127 | 4KB-64 | 4KB-63 | ... 4KB-1 | E0 | E1 | ... E63 | E160B-64 ... E160B-1 |
| Upper bit(Odd) | 1 | ... 1 | 0 | 1 | ... 1 | 1 | ... | 1 | 0 | 1 | ... 1 | 1 | 1 | ... 0 | 1 | 0 | ... 0 | 1 | 0 | ... 0 | 0 ... 1 |
| Upper bit(Even) | 1 | ... 1 | 1 | 1 | ... 0 | 1 | ... | 1 | 1 | 1 | ... 1 | 1 | 0 | ... 1 | 1 | 0 | ... 0 | 0 | 0 | ... 1 | 1 ... 0 |
| Lower bit(Odd) | 0 | ... 0 | 0 | 0 | ... 0 | 0 | ... | 0 | 0 | 0 | ... 1 | 0 | 0 | ... 1 | 0 | 1 | ... 0 | 1 | 1 | ... 0 | 1 ... 1 |
| Lower bit(Even) | 1 | ... 0 | 0 | 1 | ... 0 | 0 | ... | 0 | 0 | 1 | ... 1 | 0 | 1 | ... 1 | 1 | 0 | ... 1 | 0 | 1 | ... 0 | 0 ... 0 |
| Upper bit(Odd) | 1 | ... 1 | 1 | 1 | ... 1 | 1 | ... | 1 | 0 | 0 | ... 0 | 0 | 1 | ... 1 | 1 | 1 | ... 1 | 1 | 1 | ... 0 | 0 ... 0 |
| Upper bit(Even) | 1 | ... 1 | 1 | 1 | ... 1 | 1 | ... | 1 | 0 | 0 | ... 1 | 0 | 0 | ... 0 | 0 | 0 | ... 0 | 0 | 1 | ... 1 | 1 ... 1 |
| Lower bit(Odd) | 0 | ... 0 | 0 | 0 | ... 1 | 0 | ... | 0 | 1 | 1 | ... 0 | 1 | 1 | ... 1 | 1 | 1 | ... 1 | 1 | 0 | ... 1 | 1 ... 1 |
| Lower bit(Even) | 0 | ... 0 | 0 | 0 | ... 0 | 0 | ... | 0 | 0 | 0 | ... 0 | 1 | 1 | ... 0 | 0 | 1 | ... 0 | 1 | 1 | ... 1 | 0 ... 1 |

| 64Cell(R0) | | | 64Cell(R1) | | | ... | 64Cell(R511) | | | ECC 64Cell(RE0) | | | ... | ECC 64Cell(RE19) | | |
|---|---|---|---|---|---|---|---|---|---|---|---|---|---|---|---|---|
| N0 | N1 | ...N63 | N64 | N65 | ...N127 | ... | 4KB-64 | 4KB-63 | ...4KB-1 | E0 | E1 | ...E63 | ... | E160B-64 | ... | E160B-1 |
| ①1 | 0 | ...0 | 1 | 0 | ...0 | ... | 1 | 0 | ...0 | 1 | 0 | ...0 | ... | 0 | ... | 1 |
| 1 | 1 | ...1 | 1 | 0 | ...1 | ... | 0 | 1 | ...1 | 0 | ⓪0 | ...1 | ... | 1 | ... | 0 |
| 0 | 0 | ...1 | ①1 | 0 | ...1 | ... | 0 | 1 | ...0 | 1 | 1 | ...0 | ... | 1 | ... | 1 |
| 0 | 1 | ...0 | 1 | 1 | ... | ... | 1 | 0 | ...1 | 0 | 1 | ...0 | ... | 0 | ... | 0 |
|  | ... |  |  | ... |  |  |  | ... |  |  | ... |  |  | ... |  |  |
| 1 | 1 | ...1 | 0 | 0 | ...1 | ... | 1 | 0 | ...1 | 0 | 1 | ...0 | ... | 1 | ... | 0 |
| 0 | 0 | ...1 | 0 | 1 | ...0 | ... | 0 | 1 | ...0 | 1 | 1 | ...1 | ... | 1 | ... | 1 |
| 1 | 0 | ...0 | 1 | 1 | ...1 | ... | 0 | 0 | ...⓪0 | 1 | 0 | ...1 | ... | 0 | ... | 0 |
| 0 | 0 | ...0 | 1 | 1 | ...0 | ... | 1 | 1 | ...0 | 1 | 1 | ...1 | ... | 0 | ... | 1 |

FIG.9C

| Col+IO | Rev for Rcell | | R512Cell | | R20Cell for ECC | | 64Cell(R0) | | | 64Cell(R1) | | | ... | 64Cell(R511) | | | ECC 64Cell(RE0) | | | ECC 64Cell(RE19) |
|---|---|---|---|---|---|---|---|---|---|---|---|---|---|---|---|---|---|---|---|---|
| | RR0 | ... 8 | R0 | R1 ... R511 | RE0 | ... RE19 | N0 | N1 | ... N63 | N64 | N65 | ... N127 | ... | 4KB-64 | 4KB-63 | ... 4KB-1 | E0 | E1 | ... E63 | ... E160B-64 ... E160B-1 |
| Upper bit(Odd) | 1 | ... | 0 | 1 ... 1 | 1 | ... 1 | 0 | 1 | ... 1 | 1 | 0 | ... 0 | ... | 1 | 1 | ... 0 | 1 | 0 | ... 0 | ... 0 1 |
| Upper bit(Even) | 1 | ... | 1 | 1 ... 1 | 1 | ... 1 | 1 | 1 | ... 1 | 1 | 0 | ... 1 | ... | 0 | 0 | ... 1 | 0 | 0 | ... 1 | ... 1 0 |
| Lower bit(Odd) | 0 | ... | 0 | 0 ... 0 | 0 | ... 0 | 0 | 0 | ... 1 | 1 | 0 | ... 1 | ... | 0 | 1 | ... 0 | 1 | 1 | ... 0 | ... 1 1 |
| Lower bit(Even) | 0 | ... | 0 | 0 ... 0 | 0 | ... 0 | 1 | 1 | ... 1 | 1 | 1 | ... 1 | ... | 1 | 1 | ... 1 | 0 | 1 | ... 0 | ... 0 0 |
| Upper bit(Odd) | 1 | ... | 1 | 1 ... 1 | 1 | ... 1 | 0 | 1 | ... 1 | 0 | 0 | ... 1 | ... | 1 | 0 | ... 1 | 0 | 1 | ... 0 | ... 0 0 |
| Upper bit(Even) | 1 | ... | 1 | 1 ... 1 | 1 | ... 0 | 1 | 0 | ... 0 | 1 | 1 | ... 0 | ... | 0 | 1 | ... 0 | 1 | 1 | ... 1 | ... 1 1 |
| Lower bit(Odd) | 0 | ... | 0 | 0 ... 0 | 1 | ... 0 | 0 | 1 | ... 0 | 1 | 1 | ... 1 | ... | 1 | 1 | ... 1 | 1 | 0 | ... 1 | ... 1 0 |
| Lower bit(Even) | 0 | ... | 0 | 0 ... 0 | 0 | ... 0 | 0 | 0 | ... 0 | 1 | 1 | ... 0 | ... | 1 | 1 | ... 0 | 1 | 1 | ... 1 | ... 0 1 |

TWO-VALUED

FOUR-VALUED
Upper-bit
Lower-bit

FOUR-VALUED
Upper-bit
Lower-bit

FOUR-VALUED
Upper-bit
Lower-bit

FOUR-VALUED
Upper-bit
Lower-bit

FIG.11

| | Col+IO | N0 | N1 | N2 | | 4KB-1 | E0 | | E160B-1 |
|---|---|---|---|---|---|---|---|---|---|
| WL0 | Upper bit(Odd) | 1 | 0 | 1→0 | ... | 1 | 0 | ... | 0 |
| | Upper bit(Even) | 0 | 1 | 0 | ... | 0 | 1 | ... | 1 |
| | Lower bit(Odd) | 1 | 1 | 1 | ... | 1 | 1 | ... | 1 |
| | Lower bit(Even) | 0→1 | 1 | 0 | ... | 0 | 0 | ... | 1 |
| | | | | | | | ... | | |
| WL1 | Upper bit(Odd) | 0 | 1 | 0 | ... | 0 | 0 | ... | 0 |
| | Upper bit(Even) | 1 | 1 | 1 | ... | 1 | 0 | ... | 1 |
| | Lower bit(Odd) | 0 | 0→1 | 1 | ... | 1 | 1 | ... | 0 |
| | Lower bit(Even) | 1 | 0 | 0 | ... | 0 | 0 | ... | 1 |

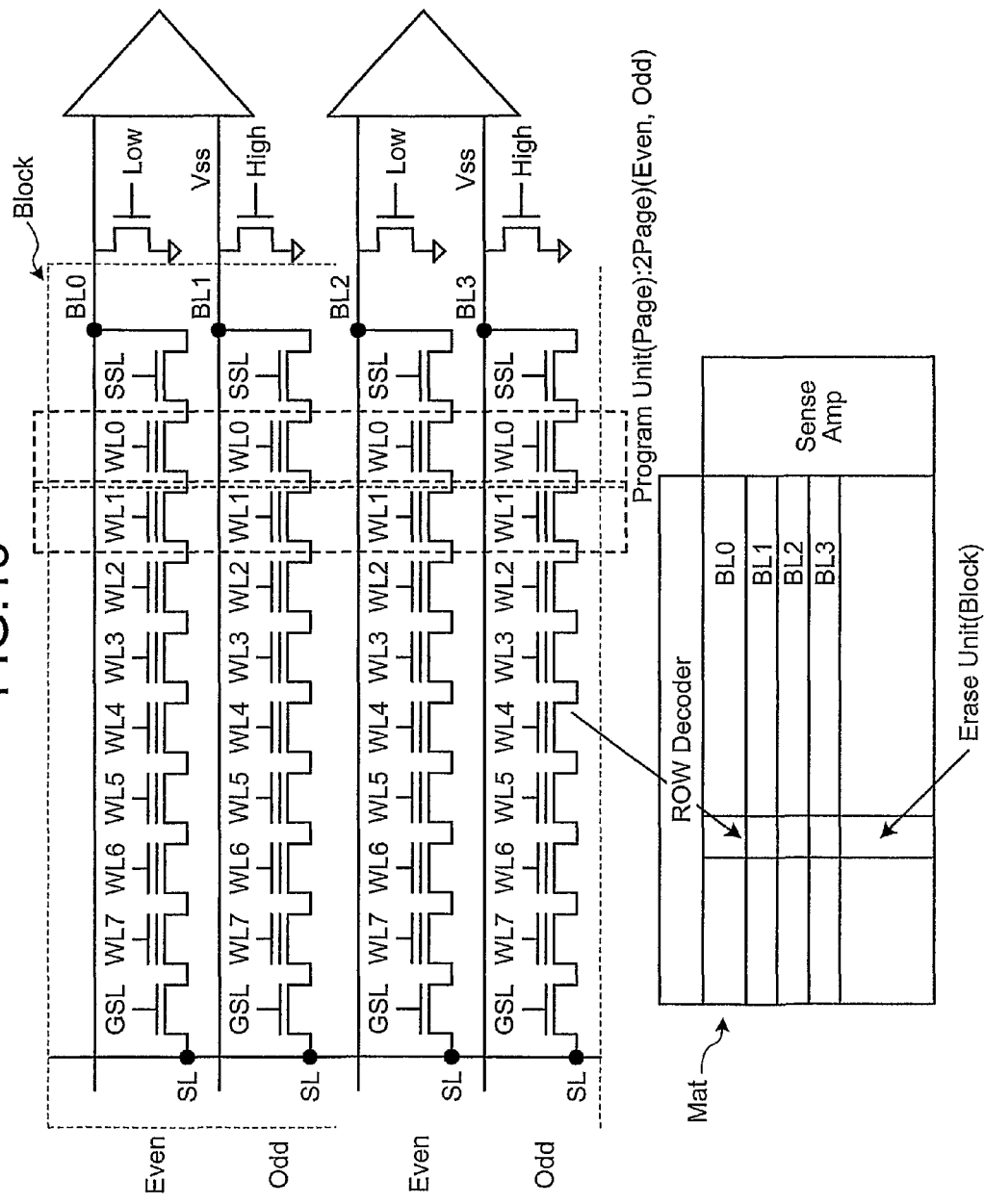

MEMORY SYSTEM

TECHNICAL FIELD

The present invention relates to a memory system.

BACKGROUND ART

Recently, semiconductor memories have been widely used for main memories of large computers, as well as personal computers, consumer electronics products, mobile phones, and the like.

Among these, a Flash-EEPROM (Electrically Erasable and Programmable Read Only Memory) nonvolatile memory represented by a NAND-Flash memory is among the fastest growing in the market, and various memory cards (SD card, MMC card, MS card, and CF card) are used as a medium for storing information of images, motion pictures, voice, and games, as a storage medium for a digital camera, a digital video, a musical instrument such as MP3, and a mobile PC (Personal Computer), and as a storage medium for a digital TV.

If the NAND-Flash memory of several tens of gigabytes can be realized, it can be used as an alternative to an HDD (Hard Disk Drive) for PC application. Further, a USB (Universal Serial Bus)-compliant card is widely used as a storage medium of the PC.

There are mainly NOR-type and NAND-type in the Flash-EEPROM nonvolatile memory. The NOR-type is characterized by high-speed read and the number of reads of about $10^{13}$, and is used as a command code storage of a portable device; however, a write-execution bandwidth is small, and therefore it is not suitable for file recording.

On the other hand, the NAND-type is capable of being highly integrated. Though an access time is as slow as 25 microseconds, it is capable of a burst read operation and has a high execution bandwidth. For the write, although a program time is 200 microseconds and an erase time is as slow as 1 millisecond, the number of bits that can be programmed or erased at a time is large. Because write data can be fetched by the burst operation and many bits can be programmed at a time, it is a memory having a high execution bandwidth.

Therefore, the NAND-type has been used in the memory cards, USB memories, and recently, in memories for mobile phones. Further, it can be expected to be used as an alternative to the HDD for the PC application.

The Flash-EEPROM nonvolatile memory is damaged at the time of performing erase/write of data with respect to a memory cell, due to application of stress to an element. Therefore, there is a problem in that the number of erase/write of data (operating life) is limited (for example, see Patent Document 1).

According to a memory management method disclosed in Patent Document 1, data divided into blocks and an inversion flag indicating whether the data bit is inverted for each block are stored, and when the inversion flag of a block to which data is to be written indicates that the bit is inverted, an inversion flag indicating that the bit is not inverted is set to write the data.

On the other hand, when the inversion flag of the block to which data is to be written indicates that the bit is not inverted, an inversion flag indicating that the bit is inverted is set to write the bit-inverted data.

In the Flash-EEPROM nonvolatile memory represented by the NAND-Flash memory, miniaturization of cells and multi-valuing for storing many pieces of information in one have been advanced to achieve large capacity.

When the is miniaturized, a tunnel oxide is thinned. Therefore, the tunnel oxide deteriorates due to repetition of program/erase, and injected electrons may leave the tunnel oxide, thereby causing generation of defective bits.

Further, due to multi-valuing of the cell, a range of a dropout amount of the injected electrons, which determines a threshold of a transistor, is narrowed, thereby causing a problem of increasing defective bits.

As a result, the number of redundant bits considerably increases to correct the defective bits, and further, there is a serious problem in that time for ECC (Error Checking and Correction), the number of logic gates, and power consumption for the correction greatly increase.

However, the memory system disclosed in Patent Document 1 is for preventing damages due to data erase/write from concentrating on a specific memory to thereby extend the operating life. Therefore, it has no effect with respect to a defective memory in which electric charge leaks during storing the data to cause garbling of data, and the defective bits cannot be relieved.

Patent Document 1: Japanese Patent Application Laid-open No. H11-25002

It is an object of the present invention to provide a memory system that can efficiently relieve a large number of defective bits with a small number of redundant bits, in a Flash-EEPROM nonvolatile memory.

DISCLOSURE OF INVENTION

A memory system according to an embodiment of the present invention comprises a Flash-EEPROM memory in which a plurality of memory cells having a floating gate or a charge trapping layer and capable of electrically erasing and writing data are arranged; a control circuit that controls a cache memory and the Flash-EEPROM memory; and an interface circuit that communicates with outside, wherein a plurality of group data and a plurality of flag data for storing presence of inversion of all bits of respective group data are stored in a memory area of the Flash-EEPROM memory.

BRIEF DESCRIPTION OF DRAWINGS

FIGS. 1A to 1E are examples of data processing in a memory system according to a first embodiment of the present invention.

FIG. 2 is a flowchart of the processing in the memory system according to the first embodiment.

FIG. 3 is a flowchart of the processing in the memory system according to the first embodiment.

FIG. 4 depicts a configuration example and effects of the memory system according to the first embodiment.

FIGS. 6A to 6C are examples of data processing in a memory system according to a second embodiment of the present invention.

Figure 8A:
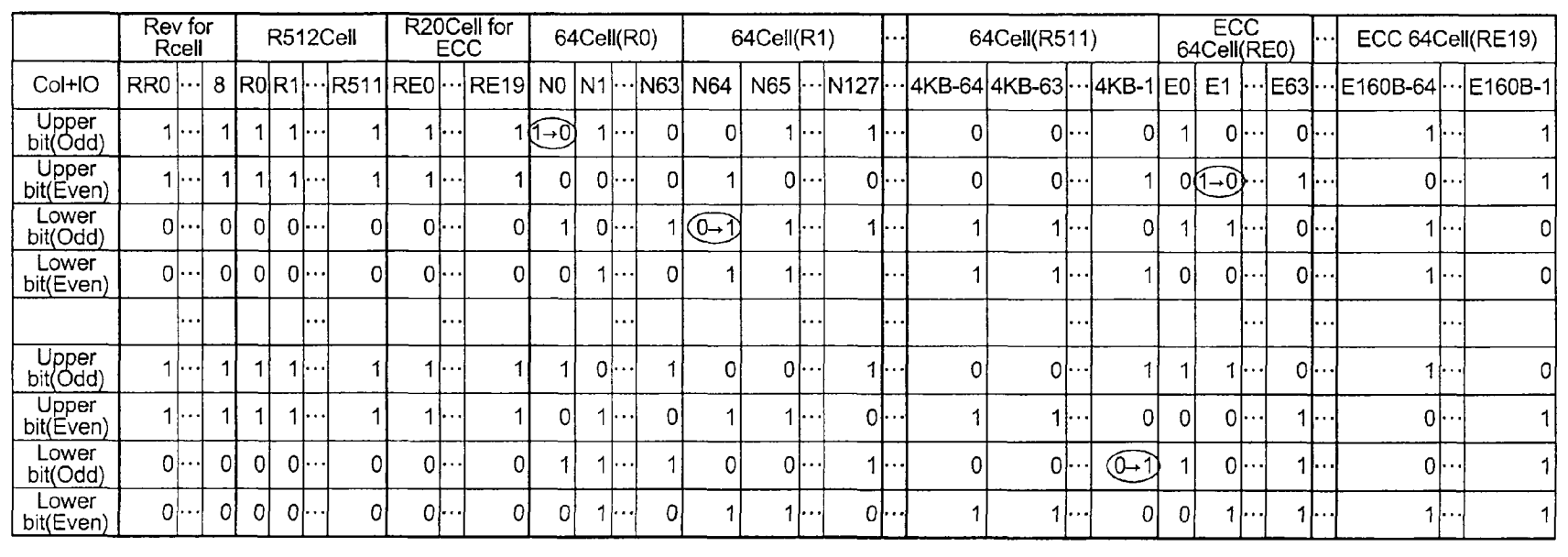
Figure 8C:
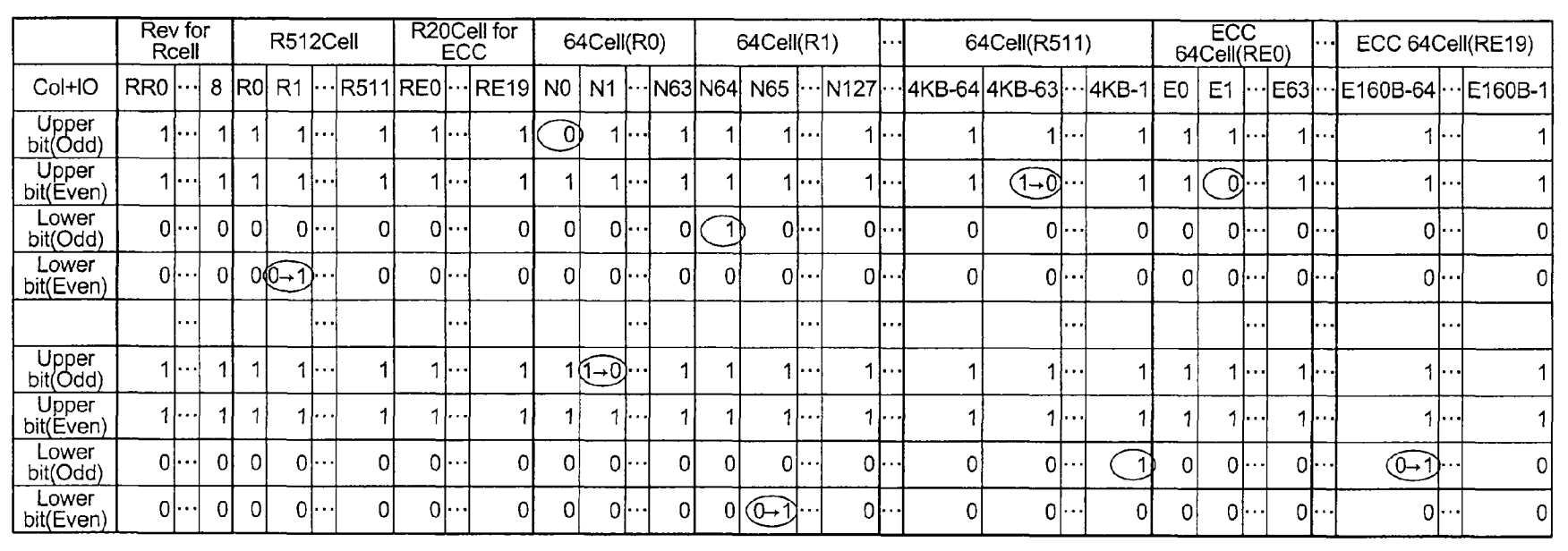

FIGS. 8A to 8E are examples of data processing in a memory system according to a third embodiment of the present invention.

FIGS. 9A to 9C are examples of data processing in a memory system according to a fourth embodiment of the present invention.

FIG. 11 is an example of a defect in the four-value NAND according to the embodiment.

FIG. 13 is a configuration example of a NAND-Flash array according to the embodiment.

BEST MODE(S) FOR CARRYING OUT THE INVENTION

Prior to explanations of embodiments, characteristics of a NAND-type Flash-EEPROM are explained with reference to FIGS. 10A to 13.

Figure 12A:
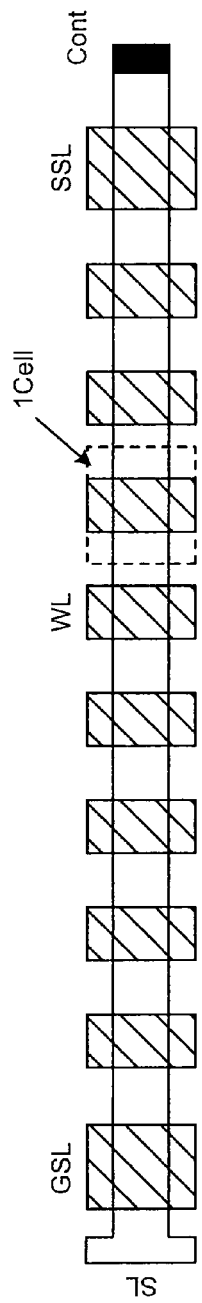
FIGS. 12A to 12C are configuration example examples of a NAND-Flash according to the embodiment.
Figure 12B:
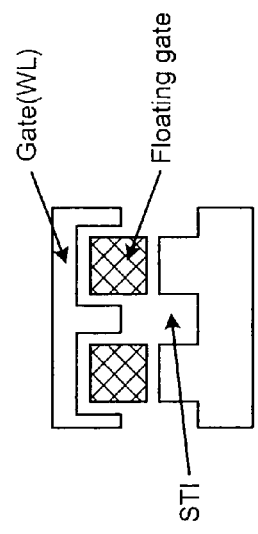
Figure 12C:
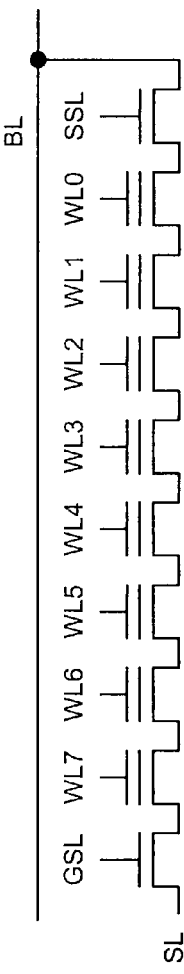

FIGS. 12A to 12C are examples of a memory cell structure of the NAND-type Flash-EEPROM, where FIG. 12A is a plan layout of a cell block, FIG. 12B is a sectional view thereof, and FIG. 12C depicts an equivalent circuit thereof.

Because the memory cell is arranged one at an intersection point of a word line and a bit line, the memory cell is suitable for high integration. Therefore, as shown in FIG. 12C, floating-gate type transistors are serially connected, and selection transistors SSL and GSL are respectively arranged at opposite ends of a bit line BL and a source line SL.

FIG. 13 depicts a configuration of a memory array.

A unit for performing one erase is a unit of a memory block in FIG. 13, as seen from a bit direction, and is one entire Mat as seen from a word direction. Capacity is about 512 kilobytes, which is one unit of erase, and is referred to as a block.

A unit of program is one word line in an erase block, and for every second bit line (even BL or odd BL).

Further, in the four-valued NAND-Flash, in the unit of program, two-bit information of upper bit and lower bit is stored in each cell.

This is referred to as a page, and in this example, one page is 4 kilobytes. In the entire block, when the number of serially connected cells is 32, 4 kB×(upper bit or lower bit)×(even BL or odd BL)×32=512 kB.

In this configuration, if erase is performed with respect to the block, a threshold of the upper bit or the lower bit decreases, which becomes "1" data, respectively.

FIGS. 10A to 10E depict a four-valued threshold distribution in which data is programmed in the upper bit or the lower bit.

Figure 10A:
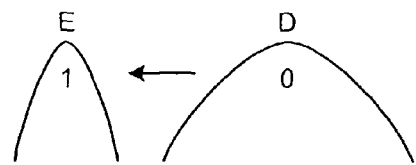
FIGS. 10A to 10E depict a distribution of a threshold Vt of a four-value NAND cell and a behavior thereof according to an embodiment of the present invention.
Figure 10B:
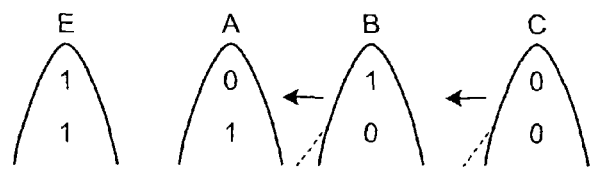
Figure 10C:
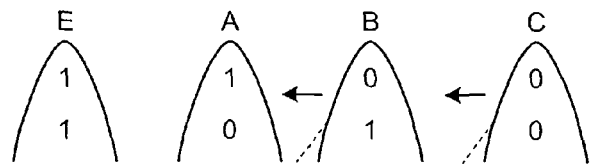
Figure 10D:
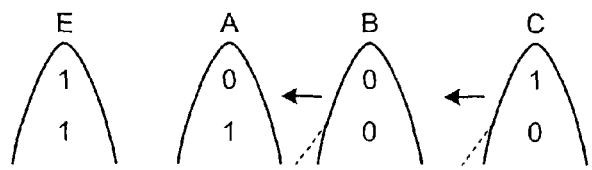
Figure 10E:
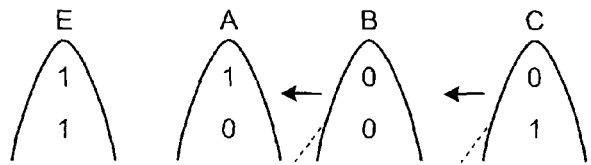

As allocation of "1" and "0" data with respect to the respective four-valued threshold distribution, four types shown in FIG. 10B to FIG. 10E are possible, and in the specification, the configuration of FIG. 10D is explained.

When data write/erase is repeated, deterioration of the tunnel oxide of the floating-gate type transistor shown in FIG. 12B occurs. Leaving data which has been written, a threshold voltage that has been increased due to injection of electrons changes by dropout of the electrons. Therefore, the data is corrupted.

For example, in the case of FIG. 10D, because the threshold state is changed from C to B, the data in the upper bit is garbled from "1" to "0".

Further, the threshold state is then changed from B to A, and therefore the data in the lower bit is garbled from "0" to "1".

A change of the threshold state from A to E hardly occurs, because the injected amount of electrons is small and an electric field is small.

FIG. 11 is an occurrence example of a defective bit in the case of FIG. 10D.

Each row indicates each page, where there are four pages of upper bit or lower bit, odd BL, and even BL for respective word lines WL0 and WL1.

Each column indicates 4-kilobyte write data (N0 to 4 kB-1) in a page, and 160-byte redundant bits (E0 to E160 B-1) for ECC correction of the write data.

After write/erase is repeated, if the data is unprocessed, in the upper bit, data is garbled from 1 to 0, and in the lower bit, data is garbled from 0 to 1.

Embodiments of the present invention will be explained below with reference to the drawings.

EMBODIMENTS

FIGS. 1A to 1E are examples of data processing in a memory system according to a first embodiment of the present invention. In this embodiment, the case of FIG. 10D is assumed. However, the embodiment can be easily applied to other cases in FIGS. 10A to 10E and to 8-valued NAND or 16-valued NAND cases.

Each row indicates each page, where examples of only word lines WL0 and WL1 are shown. There are four pages of upper bit (odd BL), upper bit (even BL), lower bit (odd BL), and lower bit (even BL) for respective word lines WL0 and WL1.

In each column, 64Cell (R0) to 64Cell (R511) and (N0 to 4 kB-1) are group data, in which normal 4-kilobyte is grouped in a unit of 64 bits.

ECC 64Cell (RE0 to RE19) is a redundant bit for relieving defective cells of normal 4 kilobytes and indicates 160-byte cells, and the redundant bits in this group data are also grouped in a unit of 64 bits.

R512Cell (R0 to R511) indicates 512-bit flag data, and 1-bit flag is provided to each of the 512 group data.

In R20Cell for ECC(RE0 to RE19), 1-bit flag data is provided to each redundant bit of 20 group data.

ECC for R (ER0 to ER19) is a redundant bit for ECC-relieving a defect of R512Cell (R0 to R511) and R20Cell for ECC (RE0 to RE19) in which inversion flag data is stored.

Figure 1A:
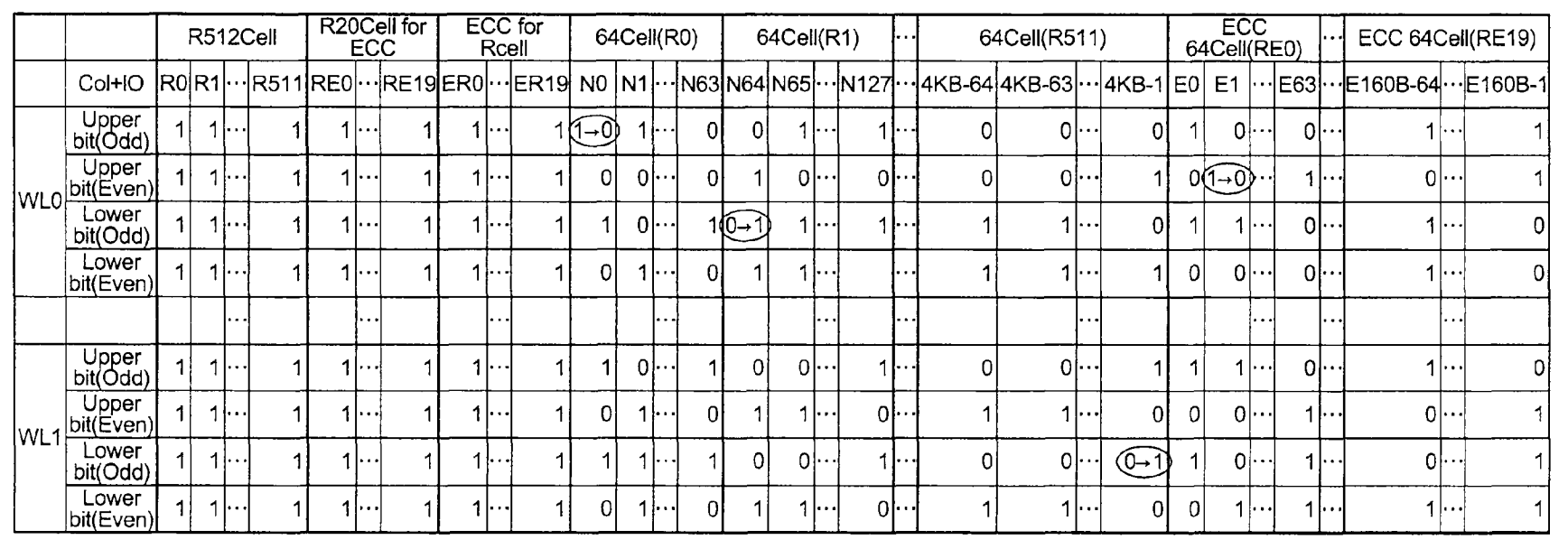

FIG. 1A indicates a case that the upper bit data is garbled from 1 to 0, the lower bit data is garbled from 0 to 1, after programming is performed with respect to the first block, and the data is held as shown in FIG. 10D.

Figure 1B:
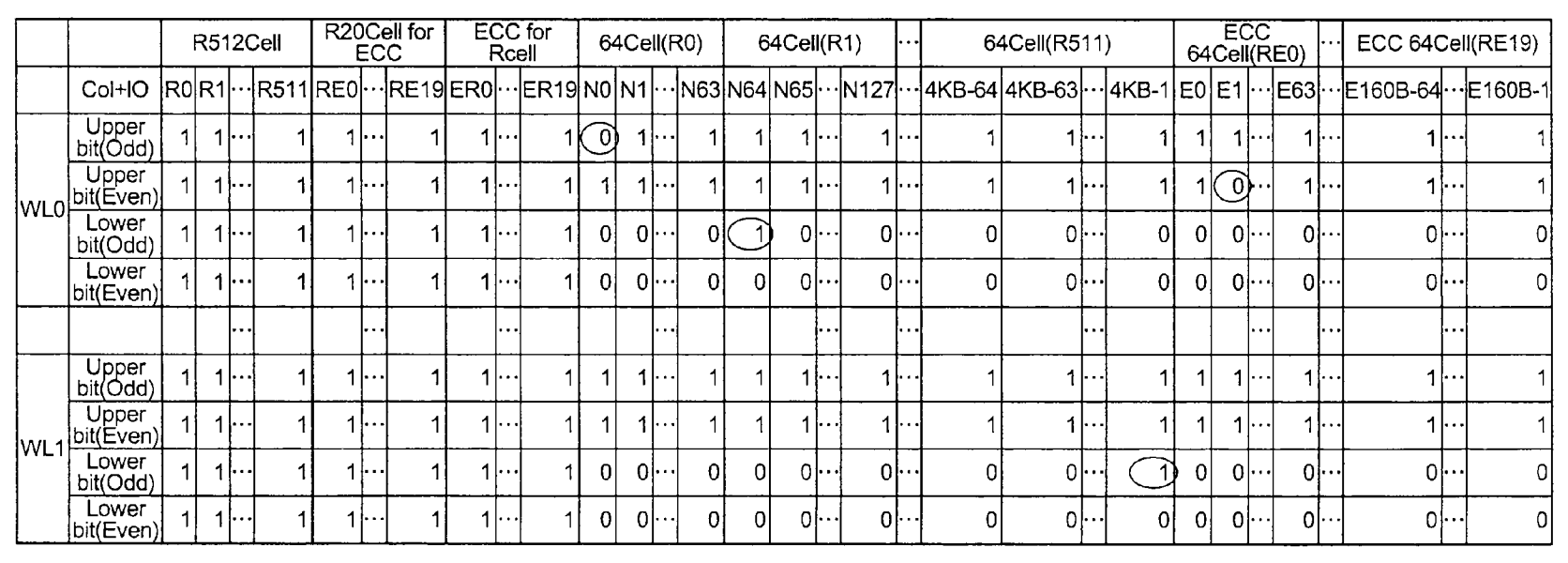

FIG. 1B indicates a case that the data is read from the NAND-Flash, and read out to the outside of the memory system, or written in another block, or a part of or all of data from outside is replaced and written in another block, and an original block is registered as an empty block by changing an address position to reduce a fatigue.

With respect to the empty block, firstly, easily garbled data is written as shown in FIG. 10D, such that upper bit is 1 and lower bit is 0.

Secondly, after the original data (data in FIG. 1A) is read and subjected to ECC correction, with respect to the bit position where the ECC correction is performed, 0 is written when it is the upper bit, or 1 is written when it is the lower bit, which is not easily garbled.

Figure 1C:
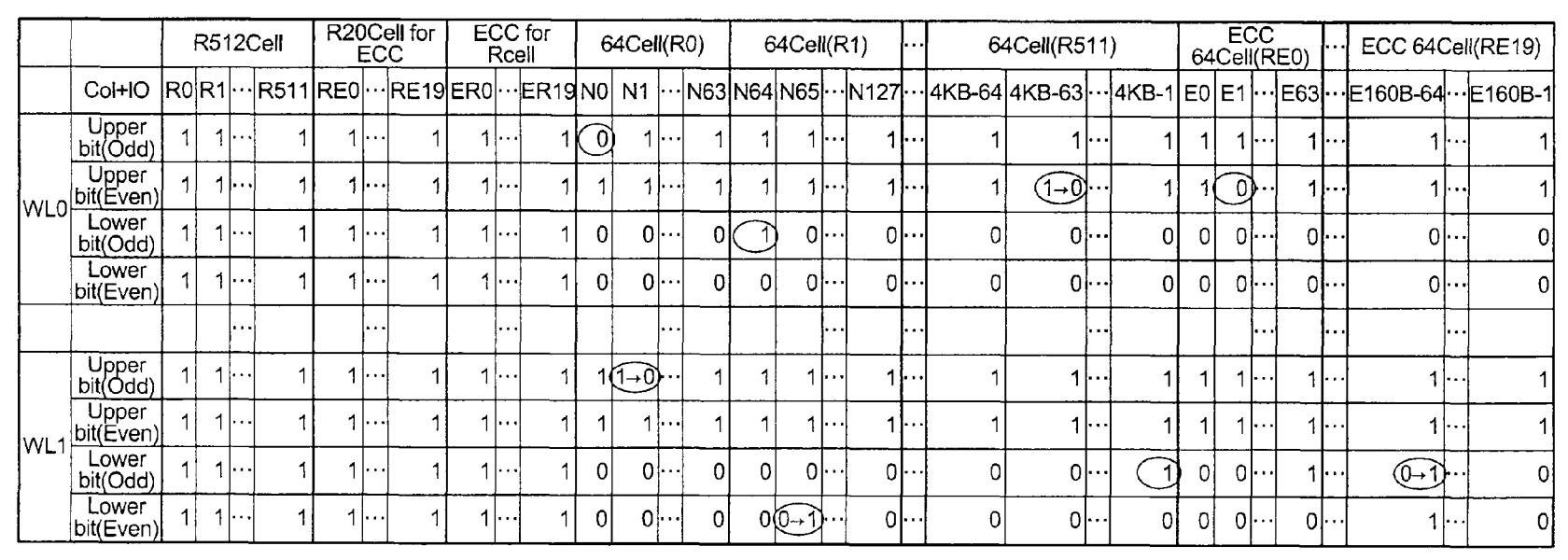

FIG. 1C indicates a case that the original block is registered as an empty block and unprocessed for a while.

In this case, the bit subjected to the ECC correction is in a hardly changed direction, and therefore is left as it is. However, among other data, in a having a negative data retention characteristic, in which the injected electrons have dropped out to reduce the threshold voltage due to being unprocessed, when it is the upper bit, data is garbled from 1 to 0, and when it is the lower bit, data is garbled from 0 to 1.

As a result, if a having caused an ECC defect before and a which is unprocessed as the empty block to cause a defect can be recognized as 0 in the case of the upper bit, or as 1 in the case of the lower bit.

FIG. 1D indicates an example of block update data when the block is registered as an arbitrary address block from the empty block, and all or a part of new bit information is written in the block.

The data has already generated ECC parity bit with respect to the redundant bit of the group data.

Figure 1E:
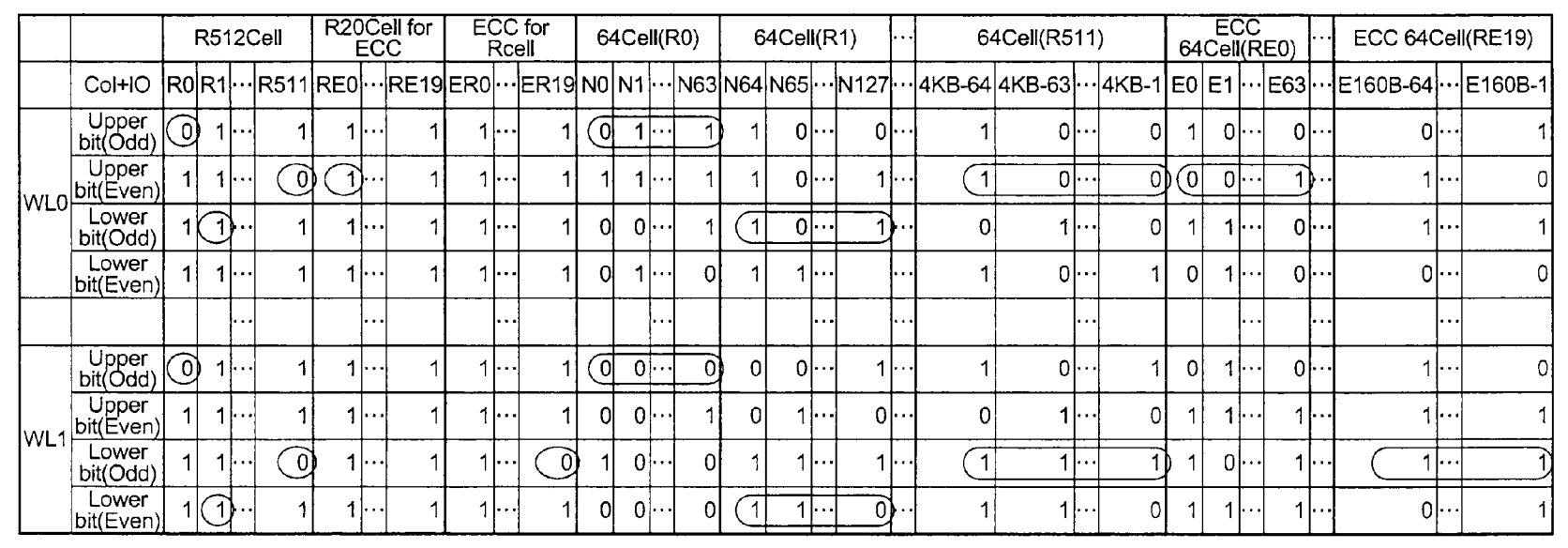

FIG. 1E indicates a data configuration when the update data in FIG. 1D is written in the block.

In FIG. 1C, garbling of data is prevented with respect to a bit which deteriorates due to data retention, and a bit in which an error has been detected by ECC. With respect to a bit position, which is recognized as a defective cell in the upper bit of FIG. 1C and becomes 0 data, if the bit at the corresponding position in FIG. 1D is 0, which is hardly garbled, the cell is left as it is. If the bit is 1, which is easily garbled, all the write bits of the data group are inverted, to change the flag of the corresponding group data to 0 for storing that the data is inverted.

Similarly, with respect to a bit position, which is recognized as a defective cell in the lower bit of FIG. 1C and becomes 1 data, if the bit at the corresponding position in FIG. 1D is 1, which is hardly garbled, the cell is left as it is. If the bit is 0, which is easily garbled, all the write bits of the data group are inverted, to change the flag of the corresponding group data to 0 for storing that the data is inverted.

This processing is performed as well with respect to the redundant bit of the group data. Lastly, the parity bit is generated with respect to the flag data, and the respective group data, the redundant bit of the group data, flag data, and the redundant bit of the flag data are written in the NAND-Flash (the block in FIG. 1C) as the update data.

In the present embodiment, even if the group data is divided finely, only 1-bit flag data is required for each group. Therefore, relieving efficiency is very high, as compared to the ECC, redundancy and the like.

That is, a large number of defective bits can be relieved with a small number of redundant bits. Because the flag data has a small capacity, even if a powerful ECC is installed to considerably suppress an occurrence of error, an overhead can be decreased.

Next to consider is a case that the write data in FIG. 1E is read to generate an empty block, and the data is updated to generate another block.

From the data in FIG. 1E, ECC correction is first performed with respect to the flag data. Inversion of the group data is then performed corresponding to the flag data. Lastly, by performing the ECC correction with respect to the group data, read of the write data is complete.

At this time, if an ECC correction bit is stored, advancement to the state of FIG. 1B is possible. The process thereafter is the same as described above.

In the present embodiment, by combining inversion of the flag data and the ECC, a decrease of a threshold voltage Vt due to dropout of the injected electrons as well as other defects such as disturbance can be relieved.

When the respective group data is set to about 64 bits as in this embodiment, probability of double failure becomes very small. Even if double failure occurs, it can be relieved by the ECC.

According to the present embodiment, even if data is written in a block, or the block is empty, an easily deteriorated bit in the original data can be detected with small flag data, and it can be prevented that the data to be written next is failed.

FIG. 2 is a flowchart of the processing in the memory system according to the first embodiment, which is a flowchart when data is read from the NAND-Flash, and read out to the outside of the memory system, or written in another block, and the block from which the data is read is registered as an empty block. FIG. 3 is a flowchart of the processing in the memory system according to the first embodiment, which is a flowchart when data is written in the empty block.

In the processing flow of the memory system shown in FIGS. 2 and 3, basically the operation shown in FIGS. 1A to 1E is generalized and shown as a flowchart, and the same effect as in FIGS. 1A to 1E can be expected.

RevGroupData, redundant bit of RevGroupData, RevFlagData, and redundant bit of RevFlagData respectively indicate the group data, the redundant bit for ECC correction of the group data, flag data, and the redundant bit for ECC correction of flag data.

A memory for storing the bit position for ECC correction of the respective RevGroupData can be provided on a controller side or can be written in another NAND block.

As a measure against momentary stop, it is desired to store the memory in a high-speed nonvolatile ferroelectric memory.

Figure 14C:
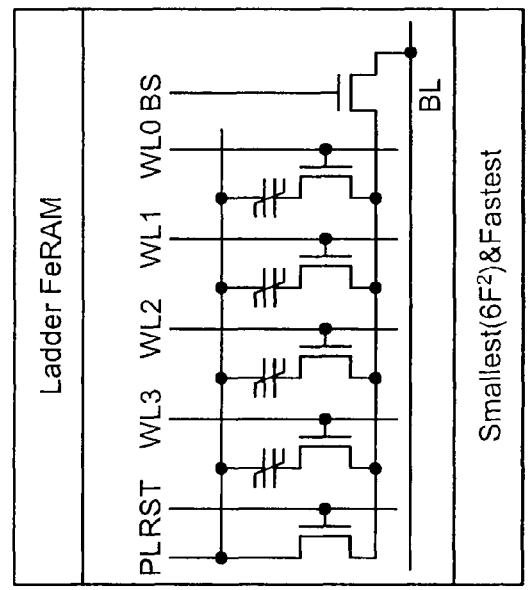
FIGS. 14A to 14C are examples of a nonvolatile ferroelectric memory according to the embodiment.
Figure 14B:
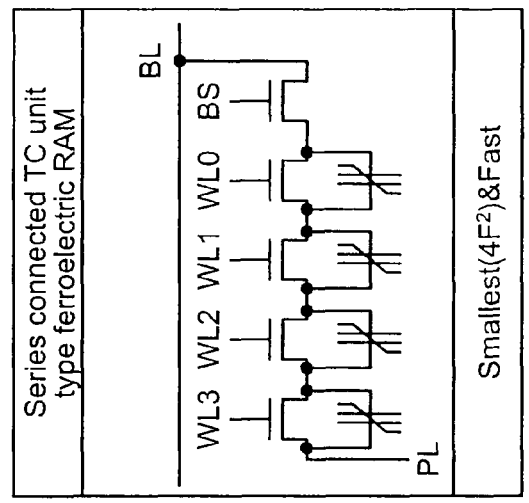
Figure 14A:
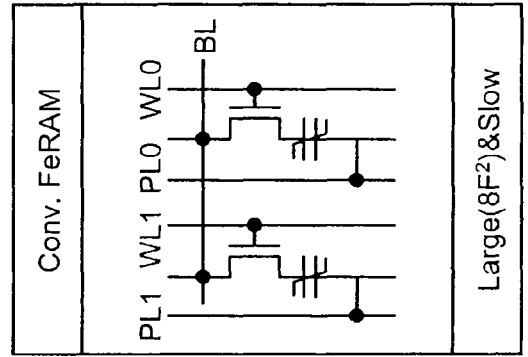

As the nonvolatile ferroelectric memory, a conventional ferroelectric memory shown in FIG. 14A, a series connected TC unit type ferroelectric RAM shown in FIG. 14B that can perform higher speed operation, or a ladder ferroelectric memory shown in FIG. 14C can be used.

The series connected TC unit type ferroelectric RAM shown in FIG. 14B is disclosed in prior applications of Japanese Patent Application Laid-Open No. H10-255483, Japanese Patent Application Laid-Open No. H11-177036, and Japanese Patent Application Laid-Open No. 2000-22010.

The ladder ferroelectric memory shown in FIG. 14C is disclosed in a prior application of Japanese Patent Application No. 2004-263383.

A MRAM (magnetic random access memory) can be used instead of the ferroelectric memory.

FIG. 4 is a configuration example of the memory system according to the first embodiment. To store 4-kilobyte data, only 64-bit correction can be performed with 20-bit redundant data according to the ECC, and only 0.016-byte correction can be performed with 64-byte redundant data according to the redundancy. In the present embodiment, however, garbling of 1024-bit data can be relieved with the 128-byte redundant data of the same level as the ECC. Therefore, it can be said that a relief efficiency of one digit or more can be realized.

Figure 5:
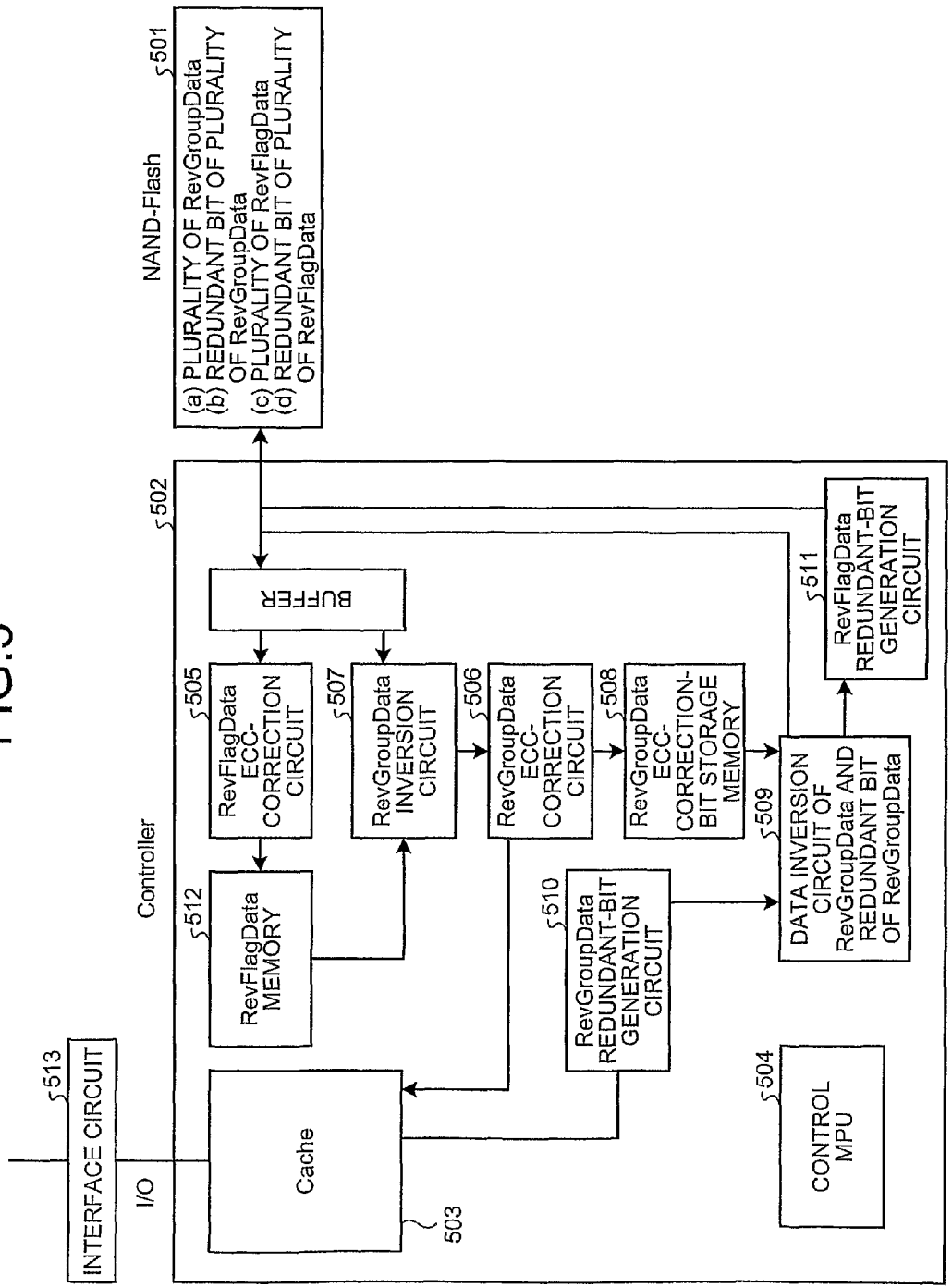
FIG. 5 is a block diagram of the memory system according to the first embodiment.

FIG. 5 is a block diagram of the memory system according to the first embodiment. The memory system comprises a NAND-Flash 501, a controller 502, and an interface circuit 513 that performs communication with outside.

The controller 502 comprises a RevFlagData ECC-correction circuit 505, a RevGroupData ECC-correction circuit 506, a RevGroupData inversion circuit 507, a RevGroupData ECC-correction-bit storage memory 508, an inversion circuit 509 for RevGroupData and ECC redundant bit thereof, a RevGroupData redundant-bit generation circuit 510, a RevFlagData redundant-bit generation circuit 511, and a RevFlagData memory 512, in addition to a cache 503 (nonvolatile or volatile) and a control MPU 504.

The RevGroupData ECC-correction-bit storage memory 508 and the RevFlagData memory 512 can be a nonvolatile ferroelectric random access memory (FeRAM), or can be stored in another block of the NAND; however, it is desired that the memory is nonvolatile.

Figure 6A:
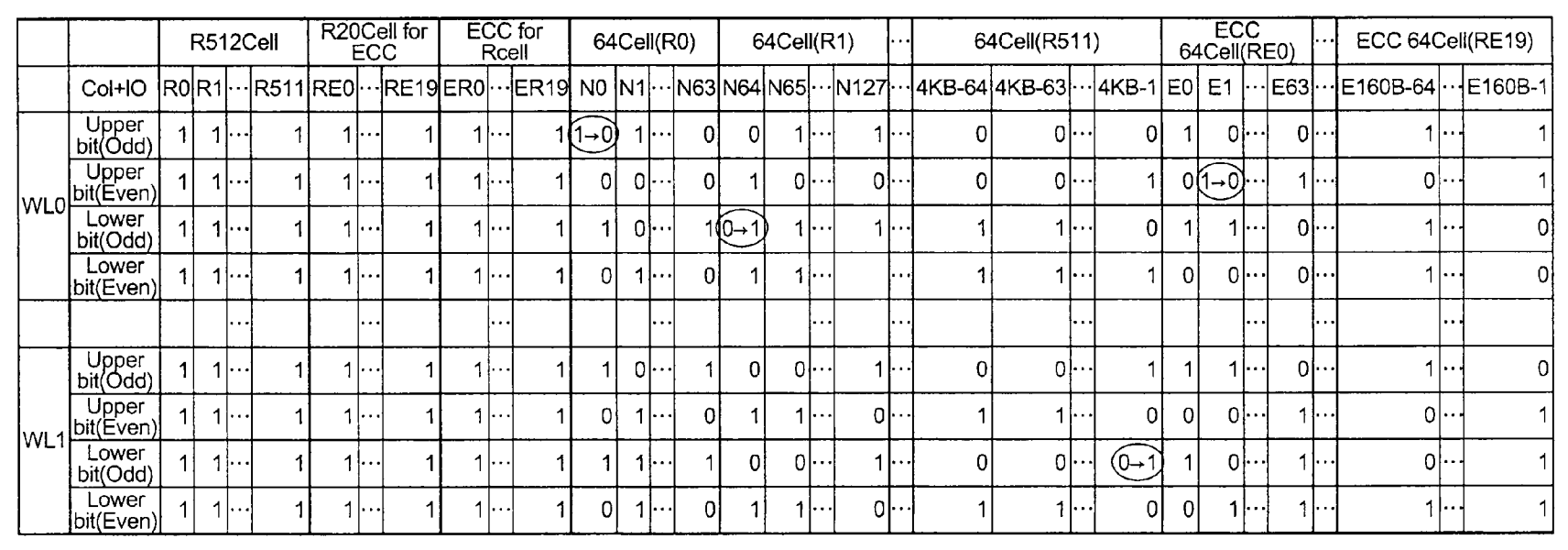
Figure 6C:
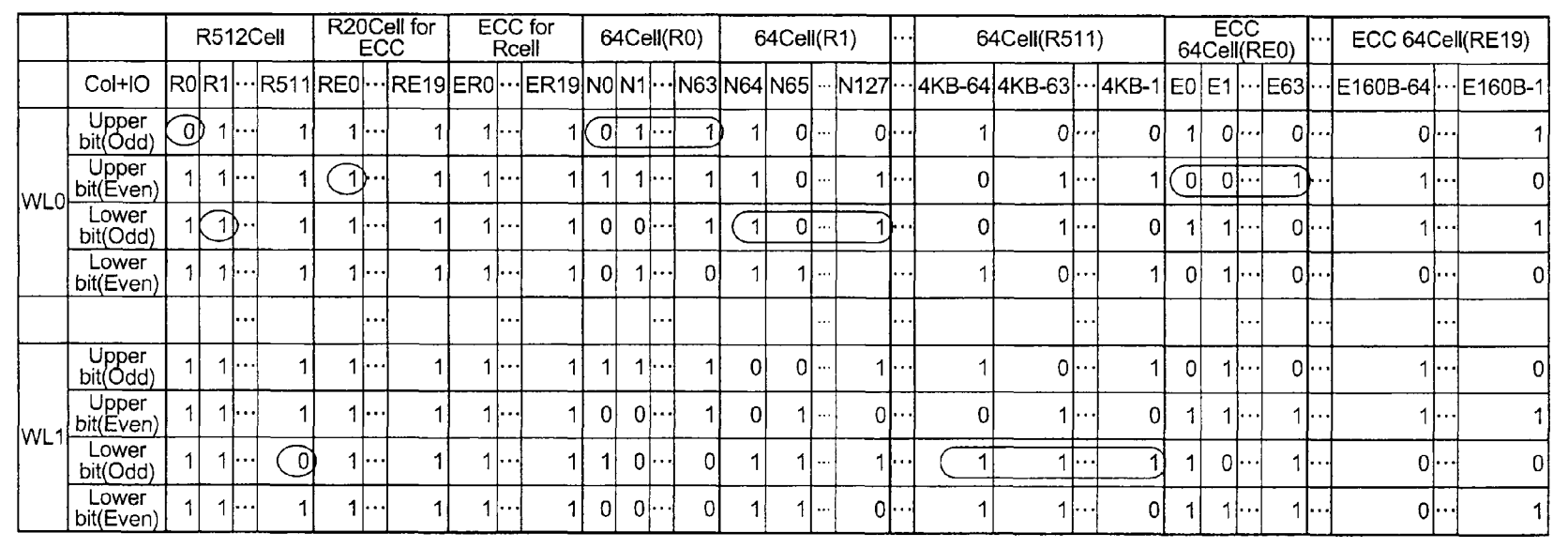
Figure 7:
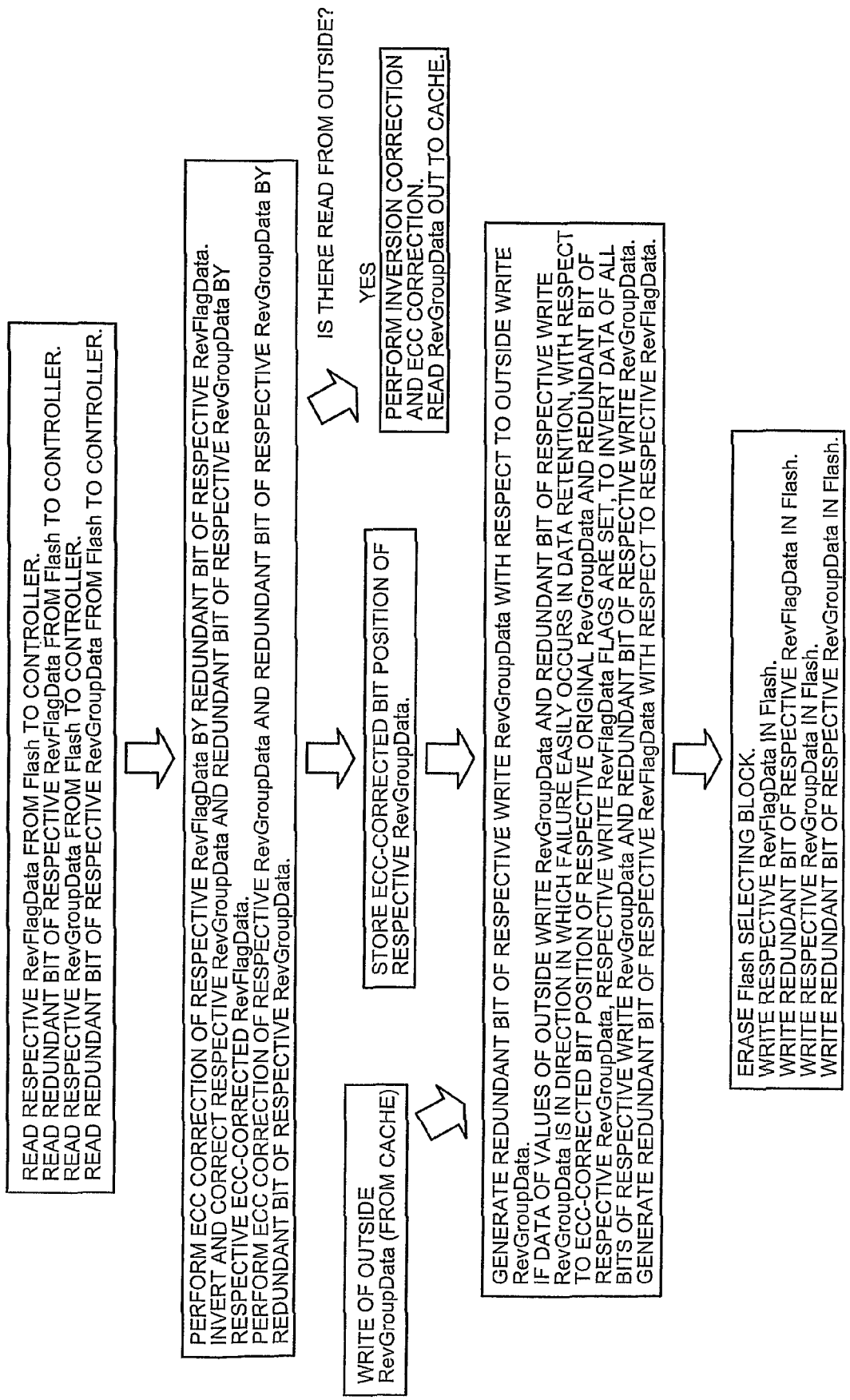
FIG. 7 is a flowchart of the processing in the memory system according to the second embodiment.

FIGS. 6A to 6C are examples of data processing in the memory system according to a second embodiment of the present invention. FIG. 7 is a flowchart of the processing in the memory system according to the second embodiment, and it is a flowchart when data is read from the NAND-Flash, and read out to the outside of the memory system, or data from the cache 503 is written.

A different point of the second embodiment from the first embodiment shown in FIGS. 1A to 3 is that data is written in the same block, not in an empty block. That is, it is different from the first embodiment that an ECC correction position of a block in which data is written (FIG. 6A) is specified, the group data is inverted so that the data is in such a direction that the data at the same position in update data (FIG. 6B) does not cause any defect, and the inverted data is written in the flag data (FIG. 6C).

In a multivalued configuration, the same assumption as that in FIG. 10D is made. A configuration other than FIG. 10D can be easily realized as well. From a viewpoint of preventing an ECC defect and garbling of bit, there are the same effects as those of FIGS. 1A to 3. Also in this case, these effects can be achieved by a circuit shown in FIG. 5.

Figure 9A:
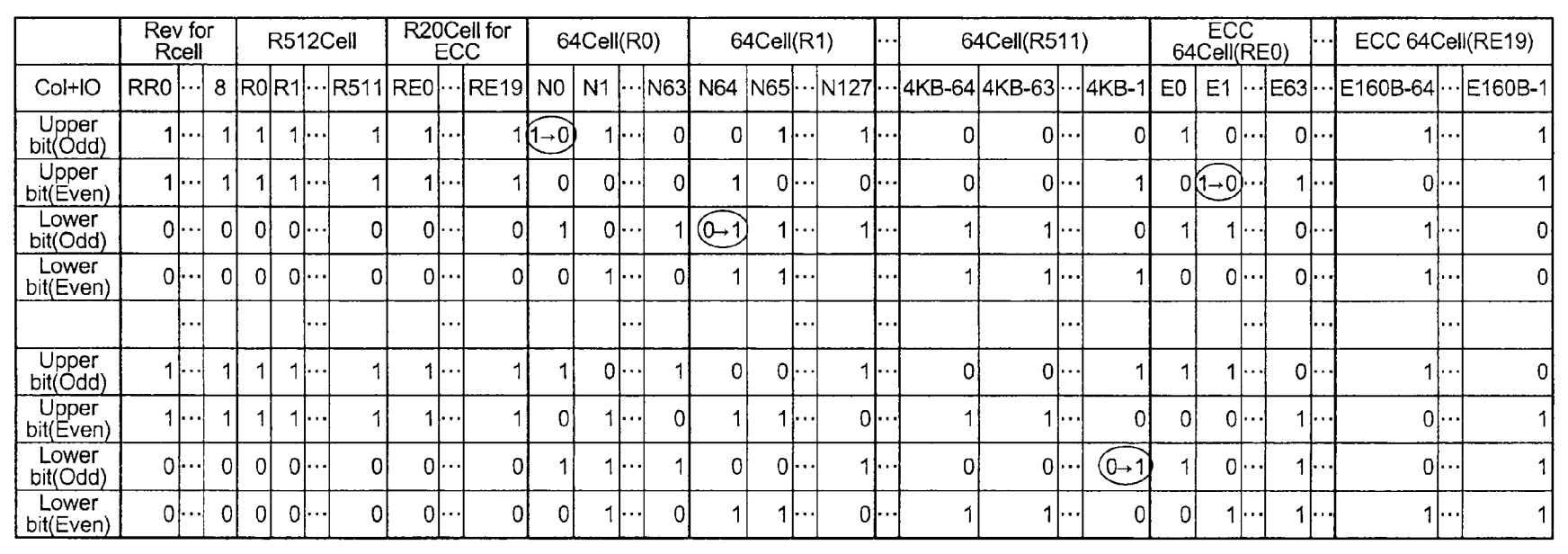

FIGS. 8A to 8E are examples of data processing in the memory system according to a third embodiment of the present invention, and FIGS. 9A to 9C are examples of data processing in the memory system according to a fourth embodiment of the present invention.

In the third and fourth embodiments, the feature different from FIGS. 1A to 1E and FIGS. 6A to 6C is that the flag data has another flag data (Rev for Rcell) therefor, as in the group data, so that flag data in which garbling of bit has occurred in an empty block or an ECC defect has occurred can be relieved to prevent gargling of data.

Other than the above feature, FIGS. 8A to 8E are substantially the same as FIGS. 1A to 1E, and FIGS. 9A to 9C is substantially the same as FIGS. 6A to 6C. Therefore, these embodiments can achieve the same effects as shown in FIGS. 1A to 1E and FIGS. 6A to 6C.

As described above, according to the respective embodiments of the present invention, such a memory system can be obtained that when large capacity of several to several tens of gigabits is realized by miniaturization and multi-valuing in the Flash-EEPROM nonvolatile memory, a large number of defective bits can be efficiently relieved with a small number of redundant bits, in the Flash-EEPROM nonvolatile memory represented by the NAND-Flash memory that has such problems that defective bits increase considerably due to the unprocessing of data after write/erase to increase the size of the redundant bit for ECC correction, that the ECC correction time becomes huge, and that a redundancy area subjected to initial screening becomes huge.

According to the present invention, in the Flash-EEPROM nonvolatile memory, a memory system that can efficiently relieve a large number of defective bits with a small number of redundant bits can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

INDUSTRIAL APPLICABILITY

As explained above, the memory system according to the present invention is useful for Flash-EEPROM nonvolatile memories, and particularly suitable for NAND-Flash memories.

The invention claimed is:

1. A memory system comprising:
a Flash-EEPROM memory in which a plurality of memory cells capable of electrically erasing and writing data are arranged;
a control circuit that controls a cache memory and the Flash-EEPROM memory;
an interface circuit that communicates with outside; and
a memory area of the Flash-EEPROM memory that is arranged in the Flash-EEPROM memory and stores a plurality of group data and a plurality of flag data for storing presence of inversion of all bits of respective group data, wherein
in the group data, "1" logic data or "0" logic data in a direction in which a failure hardly occurs in data retention is written with respect to an ECC-corrected bit in original write data, and "1" logic data or "0" logic data in a direction in which a failure easily occurs in data retention is written with respect to other bits not ECC-corrected, with respect to a block, which is registered as an empty block, of the memory areas of the Flash-EEPROM memory.

2. The memory system according to claim 1, wherein in the respective group data, at a bit position, which indicates "1" logic data or "0" logic data in a direction in which read of an original write data hardly fails, if new write data is "1" logic data or "0" logic data in the direction in which a failure easily occurs in data retention, all bits of the group data are inverted, and information indicating inversion is stored with respect to a corresponding flag data, for block write of new data with respect to the empty block of the memory areas of the Flash-EEPROM memory.

3. The memory system according to claim 2, wherein with respect to data read in a write block of the new data, of the memory areas of the Flash-EEPROM memory, when the corresponding flag data is inverted in the respective group data, data in which all the bits of the group data are inverted is designated as read data.

4. The memory system according to claim 2, wherein when it is indicated that corresponding original flag data has been inverted with respect to the original write data, the corresponding group data is inverted and ECC correction is performed with respect to the group data, and when new write data is "1" logic data or "0" logic data in the direction in which a failure easily occurs in data retention at the ECC-corrected bit position, data in which all bits of the corresponding group data are inverted and data storing information indicating the inversion for the corresponding flag data are respectively written in the corresponding group data and flag data in the memory areas of the Flash-EEPROM memory, with respect to the block for which read of old data and write of new data are performed, of the memory areas of the Flash-EEPROM memory.

5. The memory system according to claim 1, wherein the control circuit comprises a nonvolatile ferroelectric memory that stores therein the ECC-corrected bit position.

6. The memory system according to claim 1, wherein when it is indicated that corresponding original flag data has been inverted with respect to the original write data, the corresponding group data is inverted and ECC correction is performed with respect to the group data, and when new write data is "1" logic data or "0" logic data in the direction in which a failure easily occurs in data retention at the ECC-corrected bit position, data in which all bits of the corresponding group data are inverted and data storing information indicating the inversion for the corresponding flag data are respectively written in the corresponding group data and flag data in the memory areas of the Flash-EEPROM memory, with respect to the block for which read of old data and write of new data are performed, of the memory areas of the Flash-EEPROM memory.

7. The memory system according to claim 1, wherein the memory cell comprises a floating gate or a charge trapping layer.

8. A memory system comprising:
a Flash-EEPROM memory in which a plurality of memory cells capable of electrically erasing and writing data are arranged;
a control circuit that controls a cache memory and the Flash-EEPROM memory;
an interface circuit that communicates with outside; and
a memory area of the Flash-EEPROM memory that is arranged in the Flash-EEPROM memory and stores a plurality of group data and a plurality of flag data for storing presence of inversion of all bits of respective group data, wherein
in the group data, "1" logic data or "0" logic data in the direction in which a failure easily occurs in data retention is written with respect to all bits that include an ECC-corrected bit in original write data and other bits not ECC-corrected, with respect to a block, which is registered as an empty block, of the memory areas of the Flash-EEPROM memory.

9. The memory system according to claim 8, wherein in the respective group data, at a bit position, which indicates "1" logic data or "0" logic data in a direction in which read of an original write data hardly fails, if new write data is "1" logic data or "0" logic data in the direction in which a failure easily occurs in data retention, all bits of the group data are inverted, and information indicating inversion is stored with respect to a corresponding flag data, for block write of new data with respect to the empty block of the memory areas of the Flash-EEPROM memory.

10. The memory system according to claim 9, wherein with respect to data read in a write block of the new data, of the memory areas of the Flash-EEPROM memory, when the corresponding flag data is inverted in the respective group data, data in which all the bits of the group data are inverted is designated as read data.

11. The memory system according to claim 9, wherein when it is indicated that corresponding original flag data has been inverted with respect to the original write data, the corresponding group data is inverted and ECC correction is performed with respect to the group data, and when new write data is "1" logic data or "0" logic data in the direction in which a failure easily occurs in data retention at the ECC-corrected bit position, data in which all bits of the corresponding group data are inverted and data storing information indicating the inversion for the corresponding flag data are respectively written in the corresponding group data and flag data in the memory areas of the Flash-EEPROM memory, with respect to the block for which read of old data and write of new data are performed, of the memory areas of the Flash-EEPROM memory.

12. The memory system according to claim 8, wherein the control circuit comprises a nonvolatile ferroelectric memory that stores therein the ECC-corrected bit position.

13. The memory system according to claim 8, wherein when it is indicated that corresponding original flag data has been inverted with respect to the original write data, the corresponding group data is inverted and ECC correction is performed with respect to the group data, and when new write data is "1" logic data or "0" logic data in the direction in which a failure easily occurs in data retention at the ECC-corrected bit position, data in which all bits of the corresponding group data are inverted and data storing information indicating the inversion for the corresponding flag data are respectively written in the corresponding group data and flag data in the memory areas of the Flash-EEPROM memory, with respect to the block for which read of old data and write of new data are performed, of the memory areas of the Flash-EEPROM memory.

14. The memory system according to claim 8, wherein the memory cell comprises a floating gate or a charge trapping layer.

15. A memory system comprising:
a Flash-EEPROM memory in which a plurality of memory cells capable of electrically erasing and writing data are arranged;
a control circuit configured to control a cache memory and the Flash-EEPROM memory;
an interface circuit configured to communicate with outside; wherein
a plurality of group data and a plurality of flag data for storing presence of inversion of all bits of respective group data are stored in a memory area of the Flash-EEPROM memory,
wherein in the plurality of group data, the control circuit being adapted to write new group data in a form of relatively high or low threshold voltages into the Flash-EEPROM memory, wherein the control circuit is adapted to conditionally write the new group inverted form and set the corresponding flag data to indicate such data inversion if an error at a specific bit position in previously stored data of said group has been detected by ECC and the corresponding bit in new group data is associated with a relatively high threshold voltage.

16. The memory system according to claim 15, wherein in the respective group data, the control circuit reads original write data, at a bit position, in the direction in which the threshold voltage is originally low or data in which the threshold voltage is reduced in the empty block, if new write data is in the direction in which the threshold voltage increases in data retention, all bits of the group data are inverted, and information indicating inversion is stored with respect to a corresponding flag data, for block write of new data with respect to the empty block of the memory areas of the Flash-EEPROM memory.

17. The memory system according to claim 16, wherein with respect to data read in a write block of the new data, of the memory areas of the Flash-EEPROM memory, when the corresponding flag data is inverted in the respective group data, data in which all the bits of the group data are inverted is designated as read data.

18. The memory system according to claim 17, wherein the control circuit comprises a nonvolatile memory that stores therein the ECC-corrected bit position excluding the Flash-EEPROM memory.

19. The memory system according to claim 15, wherein the memory cell comprises a floating gate or a charge trapping layer.

* * * * *